(12) United States Patent
Lee

(10) Patent No.: US 8,766,093 B2
(45) Date of Patent: Jul. 1, 2014

(54) TUNER MODULE

(75) Inventor: Heungkyu Lee, Jeollanam-do (KR)

(73) Assignee: LG Innotek Co., Ltd., Seoul (KR)

( * ) Notice: Subject to any disclaimer, the term of this patent is extended or adjusted under 35 U.S.C. 154(b) by 329 days.

(21) Appl. No.: 13/322,815

(22) PCT Filed: May 29, 2010

(86) PCT No.: PCT/KR2010/003439
§ 371 (c)(1),
(2), (4) Date: Apr. 17, 2012

(87) PCT Pub. No.: WO2010/137923
PCT Pub. Date: Dec. 2, 2010

(65) Prior Publication Data
US 2012/0194305 A1 Aug. 2, 2012

(30) Foreign Application Priority Data

May 29, 2009 (KR) .......................... 10-2009-0047591

(51) Int. Cl.
*H05K 5/02* (2006.01)
*H05K 5/00* (2006.01)
(52) U.S. Cl.
USPC ............. 174/50; 174/520; 174/559; 361/600; 361/724; 361/752; 334/85
(58) Field of Classification Search
USPC ........... 174/50, 520, 559, 560, 561, 17 R, 66, 174/67; 439/76.1, 76.2, 949, 535, 536; 220/3.2, 3.8, 4.02, 241, 242; 334/85; 361/600, 601, 641, 679.01, 724, 730, 361/752, 753, 797
See application file for complete search history.

(56) References Cited

U.S. PATENT DOCUMENTS

| 6,524,136 | B2 * | 2/2003 | Kawaguchi et al. ......... 439/76.2 |
| 6,541,700 | B2 * | 4/2003 | Chiriku et al. ................. 174/50 |
| 6,570,088 | B1 * | 5/2003 | Depp et al. ...................... 174/50 |
| 6,635,821 | B2 * | 10/2003 | Loeffelholz et al. ............ 174/66 |
| 6,848,916 | B2 * | 2/2005 | Nakayama et al. ............. 174/50 |
| 7,006,357 | B2 * | 2/2006 | Otani et al. .................... 361/752 |
| 7,799,991 | B1 * | 9/2010 | Advey ............................. 174/50 |
| 7,817,431 | B2 * | 10/2010 | Baker .............................. 174/50 |
| 8,003,899 | B2 * | 8/2011 | WenLong et al. ............. 361/752 |
| 2003/0128535 | A1 | 7/2003 | Otani et al. |

FOREIGN PATENT DOCUMENTS

| JP | 2004-229212 A | 8/2004 |
| JP | 2007-116429 A | 5/2007 |
| JP | 2007-324858 A | 12/2007 |
| KR | 10-2009-0072354 A | 8/2008 |
| KR | 10-2008-0113650 A | 12/2008 |

* cited by examiner

*Primary Examiner* — Angel R Estrada
(74) *Attorney, Agent, or Firm* — Birch, Stewart, Kolasch & Birch, LLP

(57) ABSTRACT

A tuner module is characterized by: a chassis formed with lateral surfaces wrapping four corners to open both sides; an upper cover covering one opened side of the chassis to be provided with an elastic fixation end that is fixed at the lateral surface; and a lower cover applying pressure to an external surface of the elastic fixation end to cover the other opened side of the chassis whereby another elastic hitching end that is fixed at the lateral surface is provided.

20 Claims, 5 Drawing Sheets

TUNER MODULE

TECHNICAL FIELD

The present invention relates to a tuner module, and more particularly to fastening structures of upper/lower covers fastened to upper/lower end of a tuner chassis.

BACKGROUND ART

Generally, a tuner is a device synchronizing by automatically selecting a harmonic signal received from an outside. The tuner is formed therein with a shielding plate for protecting against radiation of frequency generated from a local oscillator and for preventing an ill effect caused by outside noise. The shielding plate is integrally manufactured at four sides thereof with a chassis by a press processing.

The sides of the shielding plate integrally manufactured with the chassis are coupled with upper/lower covers for protecting against foreign objects and preventing inner circuits of the chassis from being influenced by external forces.

Recently, digital televisions (TV) have been marketed that are equipped with convergence functions including HDMI (High-Definition Multimedia Interface), USB (Universal Serial Bus), Bluetooth, Wi-Fi (Wireless Networking Technology)and DVR functions. However, the digital TVs suffer from disadvantages such as out-of-proportion screen scenes and channel skips caused by noises coming from each module and interference signals from fields as various functions are added to a set-top box and a TV set. Therefore, solutions thereto are urgently called for.

DISCLOSURE OF INVENTION

Technical Problem

The present invention has been achieved to solve such problems and an object of the invention is to provide a tuner module capable of improving a shielding performance against ambient noise generated from a TV or a set-top box by changing coupling structure between a chassis and upper/lower covers of a tuner.

The disclosed technical concepts should not be construed as limited to those set forth herein. Other technical concepts not disclosed herein may be well understood and apparent to those skilled in the art having the benefit of the teachings herein.

Solution to Problem

The present invention is disclosed to solve the aforementioned problems and it is an object of the present invention to provide a tuner module in which a shielding performance has been improved against ambient noise generated from a TV or a set-top box by changing coupling structure between a chassis and upper/lower covers of a tuner.

In one general aspect of the present invention, a tuner module comprises: a chassis formed with lateral surfaces wrapping four corners to open both sides; an upper cover covering one opened side of the chassis to be provided with an elastic fixation end that is fixed at the lateral surface; and a lower cover applying pressure to an external surface of the elastic fixation end to cover the other opened side of the chassis whereby an elastic hitching end that is fixed at the lateral surface is provided.

Advantageous Effects of Invention

The present invention is advantageous in that a contact failure between a chassis and upper/lower covers can be eliminated to prevent an external noise from entering an interior of the chassis by forming a hole at a lateral surface of the chassis to allow an elastic fixation end of the upper cover to be inserted and coupled with the hole, and to allow an elastic hitching end of the lower cover to apply pressure to the hole and the elastic fixation end.

BEST MODE FOR CARRYING OUT THE INVENTION

Figure 1:
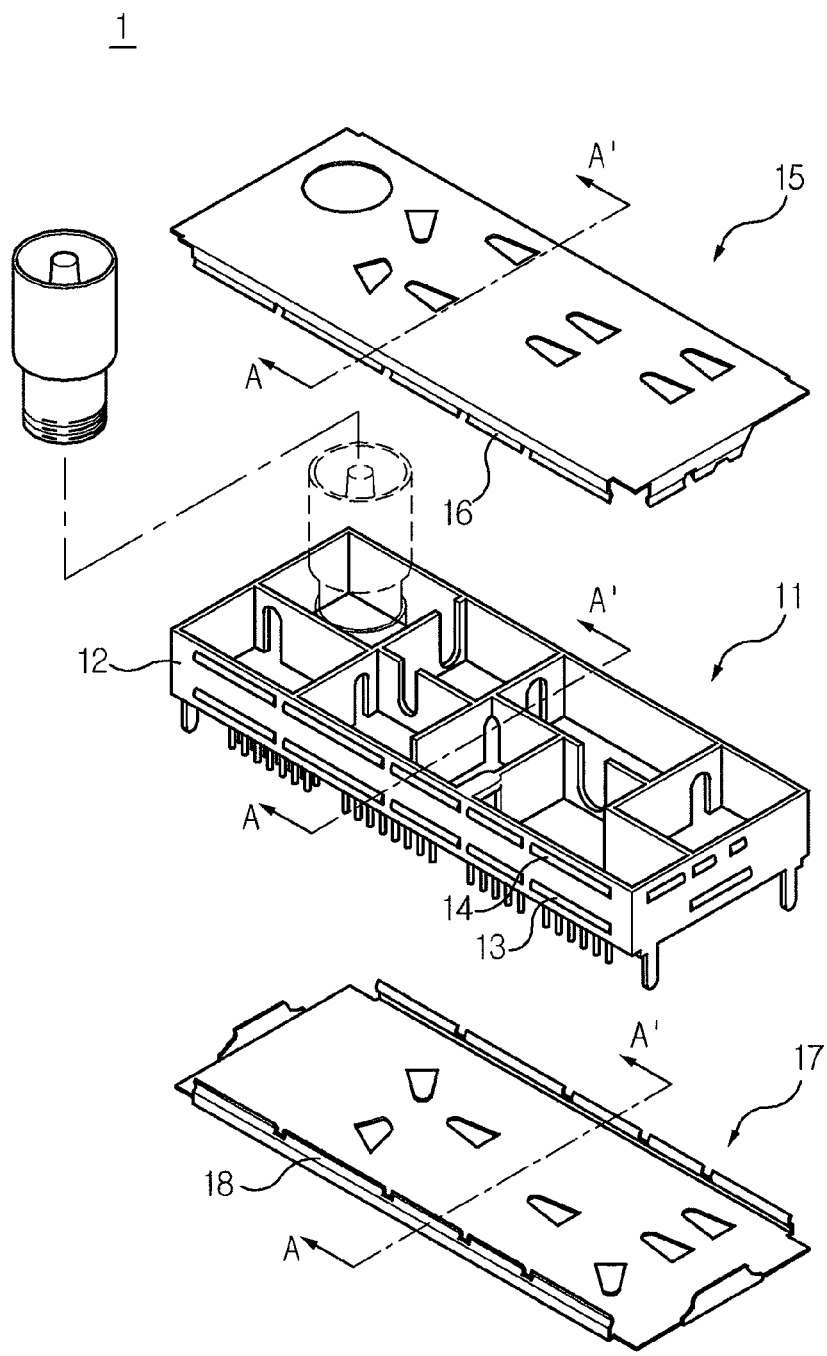
FIG. 1 is a schematic perspective view illustrating a tuner module in a separated manner according to the present invention.

The exemplary embodiment of the present invention will be described in detail with reference to the accompanying drawings, where like reference numerals refer to like parts throughout the description of several views of the drawings. In describing the present invention, detailed descriptions of constructions or processes known in the art may be omitted to avoid obscuring appreciation of the invention by a person of ordinary skill in the art with unnecessary detail regarding such known constructions and functions.

Figure 2:
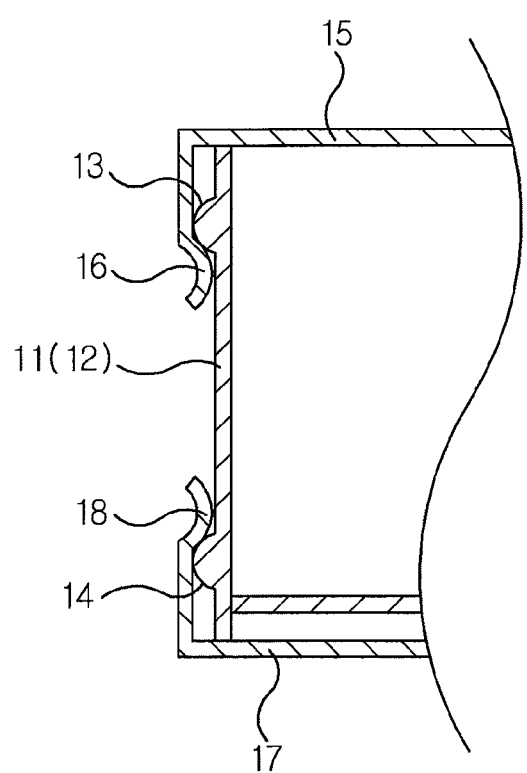
FIG. 2 is a cross-sectional view along line A-A' of FIG. 1 illustrating a partial coupling of the parts.

FIG. 1 is a schematic perspective view illustrating a tuner module in a separated manner according to the present invention, and FIG. 2 is a cross-sectional view along line A-A' of FIG. 1 illustrating a partial coupling of the parts, where a tuner module (1) may include a chassis (11), an upper cover (15) and a lower cover (17).

Upper and lower sides, which are lateral surfaces (12) of the chassis (11), are lengthwise formed with hitching lugs (13, 14), and upper/lower covers (15, 17) coupled with the hitching lugs (13, 14) of the chassis (11) are respectively formed at distal ends thereof with elastic hitching ends (16, 18).

As a result, the elastic hitching ends (16, 18) of the covers (15, 17) are vertically press-fitted into the hitching lugs (13, 14) of the chassis, where the elastic hitching ends (16, 18) are elastically hitched and coupled to the hitching lugs (13, 14), as shown in FIG. 2.

However, it should be noted that the elastic hitching ends (16, 18) of the covers (15, 17) respectively coupled to the hitching lugs (13, 14), and the hitching lugs (13, 14) of the chassis (11) are hitched at one lateral surface only.

In a case a bending deviation of the elastic hitching ends (16, 18) is generated, or a hitching elasticity decreases, there is no accurate coupling between the hitching lugs (13, 14) and the elastic hitching ends (16, 18) to reduce a coupling power between the covers (15, 17) of the chassis (11), thereby generating a loosened phenomenon. That is, the elasticity of the elastic hitching ends (16, 18) of the upper/lower covers (15, 17) weakens or the coupling between the chassis (11) and the covers (15, 17) are erroneously coupled to make the elastic hitching ends (16, 18) get loosened.

Under this circumstance, a shielding capacity of ambient noise decreases to reduce the sensitivity of digital reception of TV broadcasting or to generate beats in the case of analog reception of the TV broadcasting.

For example, in a case there is an SDRAM (Synchronous dynamic random access memory)using a 266 MHz clock about the tuner, noise may be shielded from being entering the tuner by the covers, and if the covers are not properly coupled with the chassis (11) due to a manufacturing tolerance, or if the covers are short-coupled, beats may be generated by the 266 MHz clock, and in the case of digital signal, the noise level may become relatively high during reception of weak signal to generate an error during decoding.

Mode for the Invention

Figure 3:
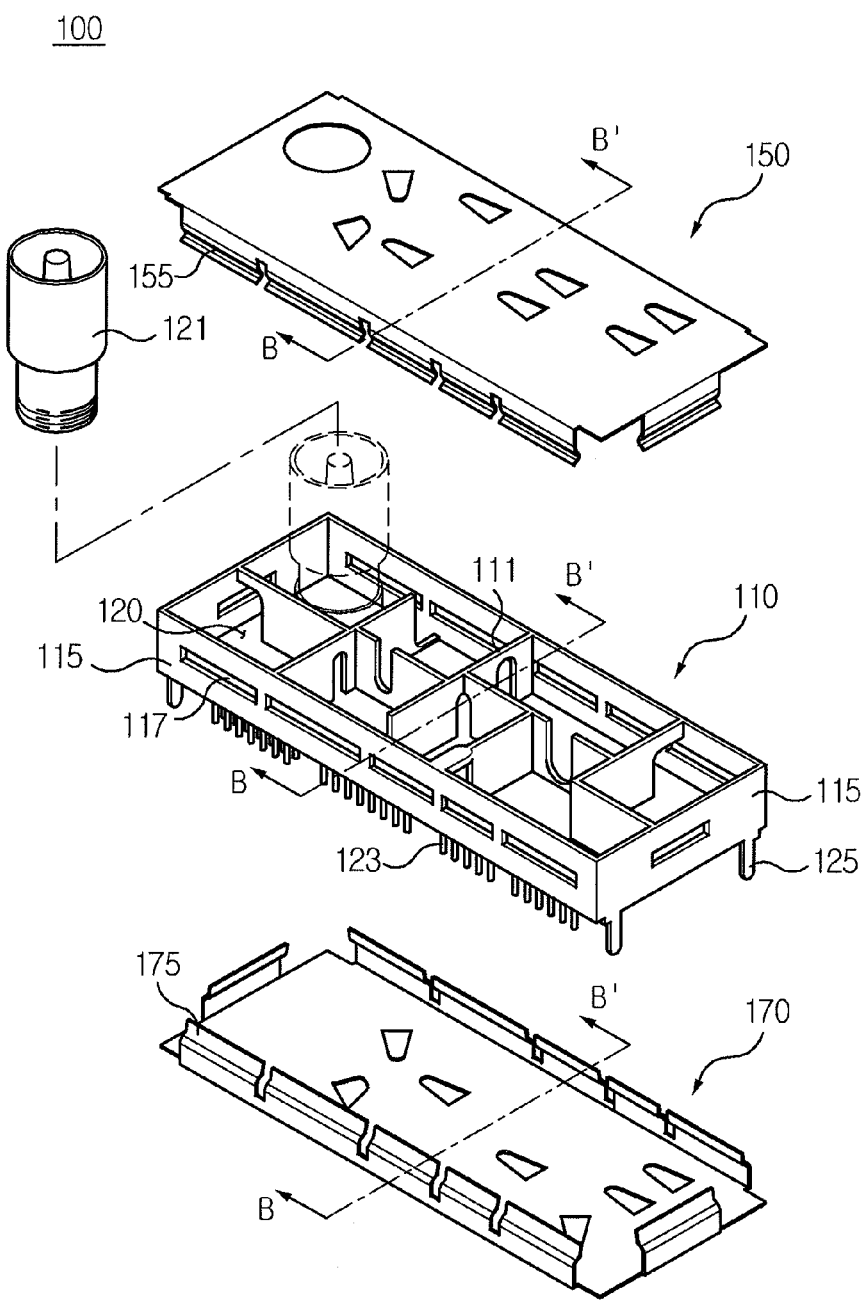
FIG. 3 is a schematic perspective view illustrating a tuner module in a separated manner according to an exemplary embodiment of the present invention.
Figure 4:
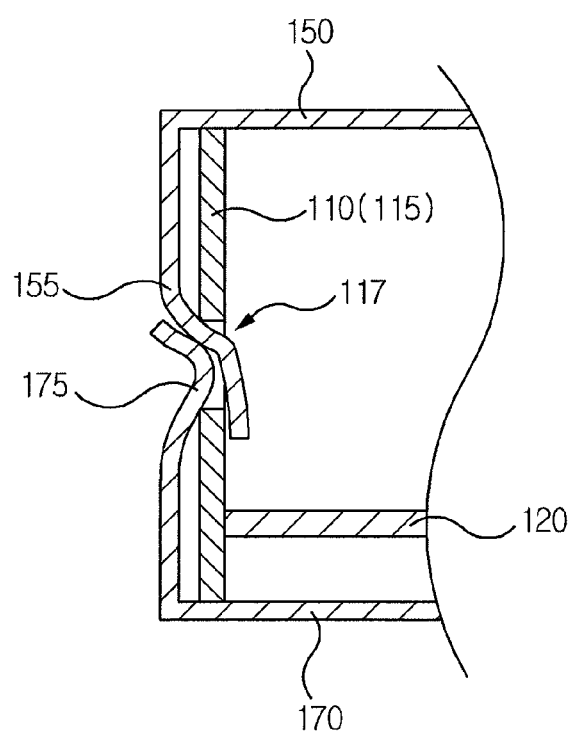
FIG. 4 is a cross-sectional view along line B-B' of FIG. 3 illustrating a partial coupling of the parts.

FIG. 3 is a schematic perspective view illustrating a tuner module in a separated manner according to an exemplary embodiment of the present invention, and FIG. 4 is a cross-sectional view along line B-B' of FIG. 3 illustrating a partial coupling of the parts, where a tuner module (100) may include a chassis (110), an upper cover (150) and a lower cover (170).

The chassis (110) may include shielding plates (111) for shielding frequency radiation generated from various parts installed thereinside and for preventing an ill effect caused by external noises, and lateral surfaces (115) integrally formed with the shielding plates (111).

The chassis (110) has a substantially square shape, inside of which is formed with various parts such as a synchronizer, a mixer, an oscillator, a filter, amplifiers (LNA, AGC, etc.) for selection of frequency through a printed circuit board (120; PCB). The chassis (110) is installed at one corner thereof with a din jack (121) connected with the PCB (120), where the din jack (121) is connected by a cable.

The chassis (110) is formed at the other lateral plate thereof with a terminal (123) connected at one distal end thereof with the PCB (120), and one corner of the chassis (110) is formed with a ground terminal (125).

Furthermore, the chassis (110) is lengthwise formed at a central portion of the lateral surface (115) with holes (117). The holes (117) are formed to couple upper/lower covers (150, 170), the widths, the number, the shapes and positions of which may be varied according to design. Preferably, each hole (117) has a rectangular shape, an oval shape or a slot shape each lengthwise formed in series along the lengthwise direction of the lateral surface (115).

The upper cover (150) is a plate for shielding entry of electromagnetic wave noise and foreign objects into the chassis (110) from outside by covering an upper portion of the chassis (110), and is formed at a distal end thereof with a bent elastic fixation end (155). The lower cover (170) is a plate for shielding entry of electromagnetic wave noise and foreign objects into the chassis (110) from outside by covering a lower portion of the chassis (110), and is formed at a distal end thereof with a bent elastic fixation end (175).

As a result, the upper/lower covers (150, 170) shield the outside noise from entering an interior of the chassis (110) to thereby protect the parts inside the chassis (110).

The tuner module (100) according to the present invention is characterized by the holes (117) for fixedly coupling the upper/lower covers (150, 170) to the chassis (110), and a fixed coupling of the bent elastic fixation end (155) and another bent elastic fixation end (175) using the holes (117).

Although FIG. 1 illustrates the hitching lugs (13, 14) in two rows to allow the upper/lower covers (15, 17) to be separately coupled, the present invention is characterized by the fact that the holes (117) are formed in series at a central portion of the lateral surface (115) to allow the upper/lower covers (150, 170) to be coupled at the same time, whereby the bent elastic fixation end (155) and the another bent elastic fixation end (175) are lengthened over the conventional styles to increase a contact surface with the chassis (110).

In the present invention thus configured, as illustrated in FIG. 4, an upper end of the chassis (110) is coupled to and covered by the upper cover (150), where, in a case the bent elastic fixation end (155) of the upper cover (150) is inserted into the hole (117) formed at the lateral surface (115) of the chassis (110), the bent elastic fixation end (155) of the upper cover (150) is inserted into the hole (117) to allow a distal end thereof to be securely fixed at an inner wall of the lateral surface (115) by elasticity.

Successively, a lower end of the chassis (110) is coupled to and covered by the lower cover (170), where the another bent elastic fixation end (175) of the lower cover (170) is fixedly inserted into the hole (117), applying an elastic pressure to an external surface of the bent elastic fixation end (155) that is inserted into the hole (117), and whereby the another bent elastic fixation end (175) of the lower cover (170) is securely fixed by being hitched between the bent elastic fixation end (155) and the hole (117).

The another bent elastic fixation end (175) of the lower cover (170) may further include a hitching piece (175') that is protruding toward the hole (117) in parallel with the upper cover (150) at a position corresponding to that of the hole (117). At this time, the hitching piece (175') is inclined toward the upper cover (150) to apply pressure to an external surface of the bent elastic fixation end (155) that is inserted into the hole (117), thereby fixing the another bent elastic fixation end (175) in a secure manner.

Therefore, the bent elastic fixation end (155) of the upper cover (150) is securely inserted into the hole (117) of the chassis (110) and in turn securely coupled to the chassis (110) by the another bent elastic fixation end (175) of the lower cover (170), whereby the coupling force between the chassis (110) and the upper/lower covers (150, 170) increases to further increase the shielding capacity against the external noise.

That is, the bent elastic fixation end (155) of the upper cover (150) that is securely inserted into the hole (117) of the chassis (110) makes the tuner module receive less influence caused by the weakened elasticity or bending deviation, thereby preventing the shielding or surface contact failure.

Figure 5:
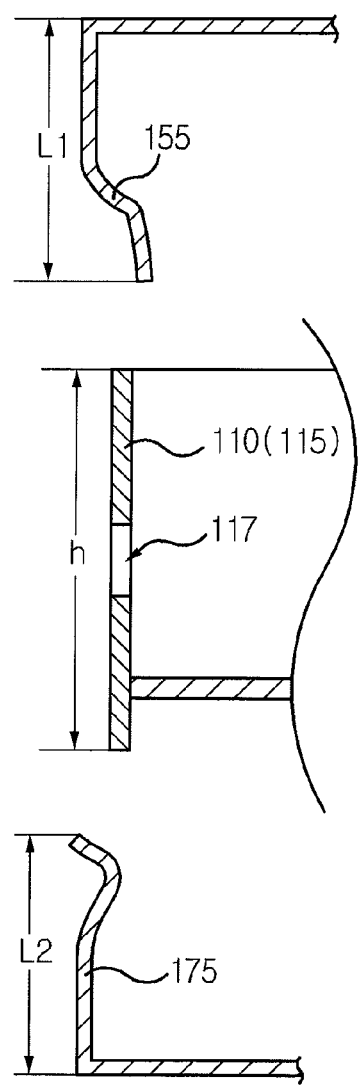
FIG. 5 is a schematic view illustrating an elastic fixation end and an elastic hitching end according to the present invention.

The bent elastic fixation end (155) of the upper cover (150) and the another bent elastic fixation end (175) of the lower cover (170) are different in length as shown in FIG. 5, where the length (L1) of the bent elastic fixation end (155) is longer than that (L2) of the another bent elastic fixation end (175). Furthermore, a total length (L1, L2) of the bent elastic fixation end (155) and the another bent elastic fixation end (175) is further longer than half (h/2) of the height (h) of the lateral surface (115) of the chassis (110).

INDUSTRIAL APPLICABILITY

The present invention has an industrial applicability in that a contact failure between a chassis and upper/lower covers can be eliminated to prevent an external noise from entering an interior of the chassis by forming a hole at a lateral surface of the chassis to allow an elastic fixation end of the upper cover to be inserted and coupled with the hole, and to allow an elastic hitching end of the lower cover to apply pressure to the hole and the elastic fixation end, whereby, even if there occurs a weakened elasticity or a bending deviation, the elastic fixation end can constitute a contact and coupling with any one surface of an interior/exterior of the hole, thereby improving a surface contact failure between the chassis and the covers, and preventing instability of terminal voltage at the antenna and generation of shocking noise caused by the surface contact failure. Another industrial applicability is that contact failure between the chassis and the upper/lower covers can be obviated to prevent an external noise from entering the interior of the chassis.

Although the present invention has been described with reference to an illustrative embodiment thereof, it should be understood that numerous other modifications and embodiments can be devised by those skilled in the art that which fall within the spirit and scope of the principles of this disclosure. More particularly, various variations and modifications are possible in the component parts and/or arrangements of the subject combination arrangement within the scope of the invention, the drawings and the appended claims. In addition to variations and modifications in the component parts and/or arrangements, alternative uses will also be apparent to those skilled in the art.

The invention claimed is:

1. A tuner module characterized by: a chassis formed with lateral surfaces wrapping four corners to open both sides; an upper cover covering one opened side of the chassis to be provided with an elastic fixation end that is fixed at the lateral surface; and a lower cover applying pressure to an external surface of the elastic fixation end to cover the other opened side of the chassis whereby another elastic hitching end that is fixed at the lateral surface is provided.

2. The tuner module of claim 1, wherein the chassis is formed at an inner side of a lateral surface thereof with a shielding plate which divides an interior of the chassis in plural number.

3. The tuner module of claim 1, wherein the lateral surface is formed with holes into which the elastic fixation ends are inserted, and the hole is sequentially coupled with the elastic fixation end of the upper cover and the another bent elastic fixation end of the lower cover.

4. The tuner module of claim 3, wherein the holes are serially formed along a lengthwise direction of the lateral surfaces.

5. The tuner module of claim 3, wherein the holes are serially formed along a lengthwise direction of a central portion of the lateral surfaces.

6. The tuner module of claim 3, wherein each hole has an oval shape or a slot shape.

7. The tuner module of claim 3, wherein the elastic fixation end of the lower cover simultaneously applies pressure to the holes and the elastic fixation end of the upper cover, and is fixed thereat.

8. The tuner module of claim 7, further comprising a hitching piece protruding toward the holes in parallel with the upper cover at a position corresponding to that of the holes.

9. The tuner module of claim 8, wherein the hitching piece is inclined toward the upper cover.

10. . The tuner module of claim 3, wherein the elastic fixation end is longer than the elastic hitching end.

11. The tuner module of claim 3, wherein the elastic fixation end is longer than half of the height of the lateral surface.

12. The tuner module of claim 3, wherein the elastic hitching end is longer than half of the height of the lateral surface.

13. A tuner module, characterized by: a chassis integrally including a lateral surfaces wrapping four corners by forming a plurality of holes, and shielding plates each dividing an interior of the lateral surfaces into plural sections; an upper cover covering one opened side of the chassis to be provided with an elastic fixation end that is fixed at the lateral surface; and a lower cover applying pressure to an external surface of the elastic fixation end to cover the other opened side of the chassis whereby another elastic hitching end that is fixed at the lateral surface is provided, wherein the hole is sequentially coupled with the elastic fixation end of the upper cover and the another bent elastic fixation end of the lower cover.

14. The tuner module of claim 13, wherein the holes are serially formed along a lengthwise direction of the lateral surfaces.

15. The tuner module of claim 13, wherein the holes are serially formed along a lengthwise direction of a central portion of the lateral surfaces.

16. The tuner module of claim 13, wherein each hole has an oval shape or a slot shape.

17. The tuner module of claim 13, wherein the elastic fixation end of the lower cover simultaneously applies pressure to the holes and the elastic fixation end of the upper cover, and is fixed thereat.

18. The tuner module of claim 13, wherein the elastic fixation end is longer than the elastic hitching end.

19. The tuner module of claim 13, wherein the elastic fixation end is longer than half of the height of the lateral surface.

20. The tuner module of claim 13, wherein the elastic hitching end is longer than half of the height of the lateral surface.

* * * * *